(12) United States Patent
Yasuda

(10) Patent No.: US 6,255,868 B1
(45) Date of Patent: Jul. 3, 2001

(54) BUFFER CIRCUIT AND HOLD CIRCUIT

(75) Inventor: Yukio Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/629,874

(22) Filed: Aug. 1, 2000

(30) Foreign Application Priority Data

Feb. 28, 2000 (JP) .......................................... P2000-051186

(51) Int. Cl.[7] .................................................... H03K 3/00
(52) U.S. Cl. ............................................. 327/108; 327/334
(58) Field of Search .................................. 327/108, 111, 327/427, 478, 94, 334; 326/86, 83, 89, 90

(56) References Cited

U.S. PATENT DOCUMENTS 5,844,433 * 12/1998 Nishimura ............................... 327/94
5,952,872 * 9/1999 Manaresi et al. ..................... 327/541
5,973,549 * 10/1999 Yuh ....................................... 327/333

* cited by examiner

Primary Examiner—Toan Tran
(74) Attorney, Agent, or Firm—Oblon, Spivak, McClelland, Maier & Neustadt, P.C.

(57) ABSTRACT

An object is to reduce the offset voltage between the input and output in a wide range of output current with a simple circuit configuration. Transistors (Q1), (Q2) and (Q3) have a size ratio of m:n:1, transistors (Q6) and (Q7) have a size ratio of 1:p, and transistors (Q4) and (Q5) have a size ratio of {(m+n+1)/p:}. Accordingly a current which is (m+n+1) times the current flowing in the transistor (Q3) is supplied to the emitter electrodes of the transistors (Q1) and (Q2). Since the ratio between the currents flowing in the transistors (Q1) and (Q2) is the same as their size ratio m:n, the emitter-base voltages are equal between the transistors (Q1) and (Q2). As a result, the offset voltage between the voltage signal inputted to the input signal line (IN) and the voltage signal outputted from the output signal line (OUT) can be suppressed in a wide range of output current.

12 Claims, 10 Drawing Sheets

F I G. 5
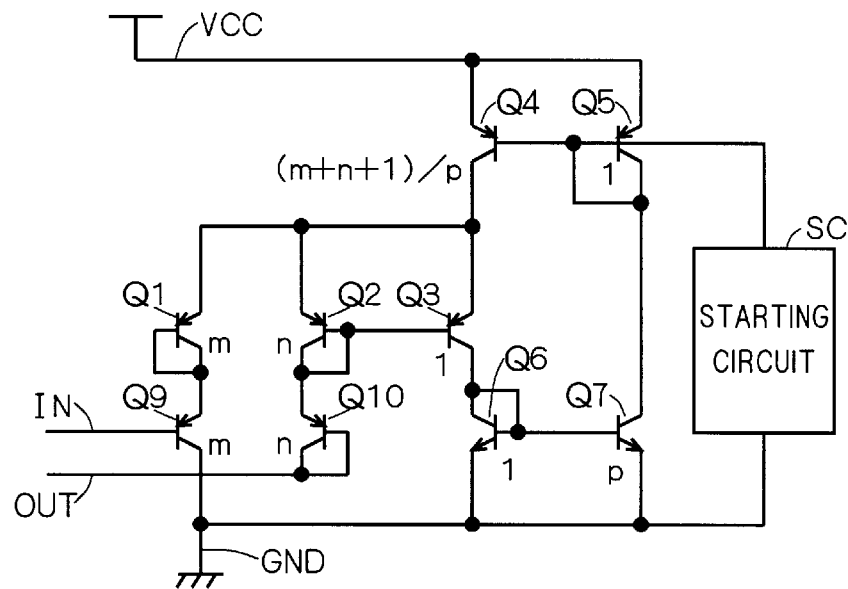
F I G. 6
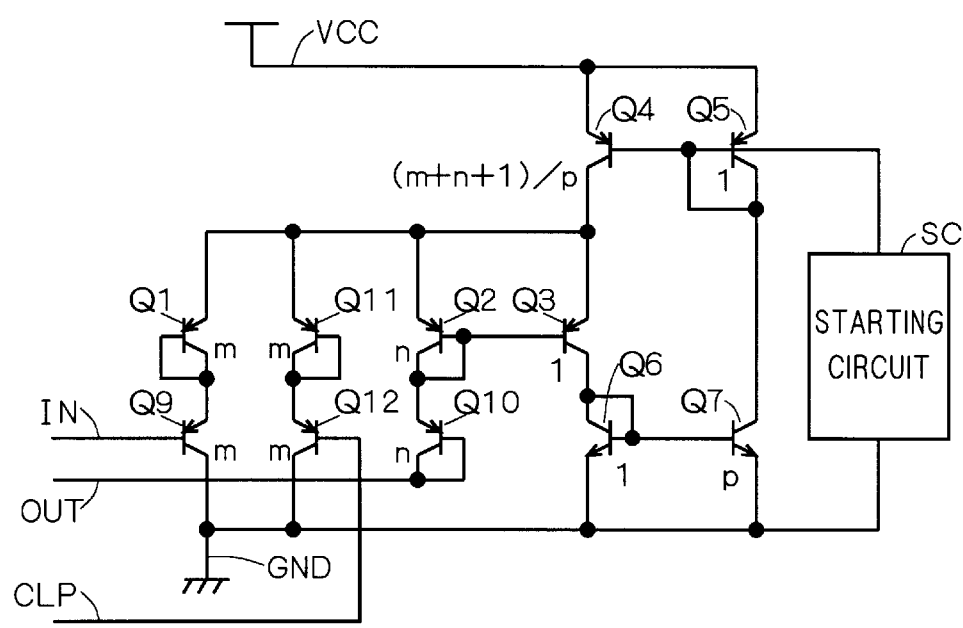

F I G. 1 0
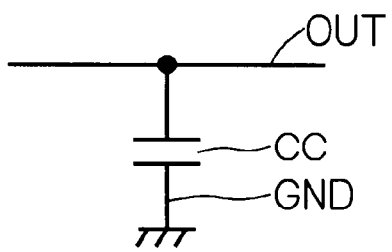
F I G. 1 1
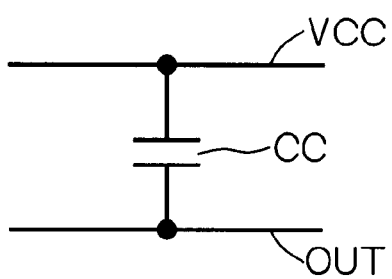
F I G. 1 2
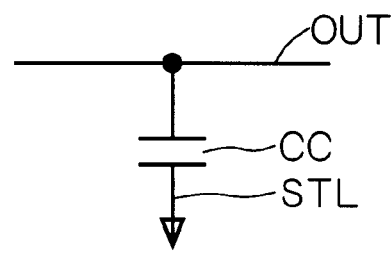

F I G. 13
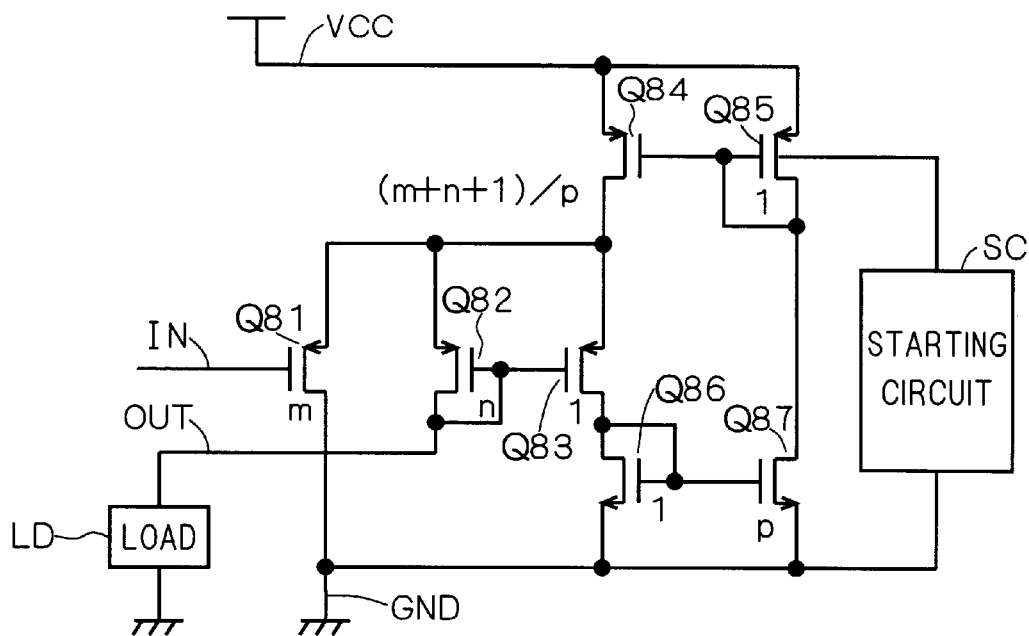
F I G. 14
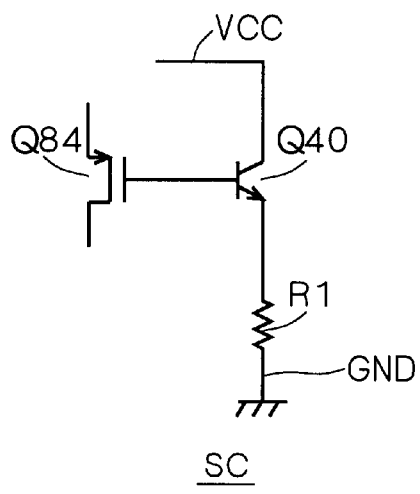

F I G. 19
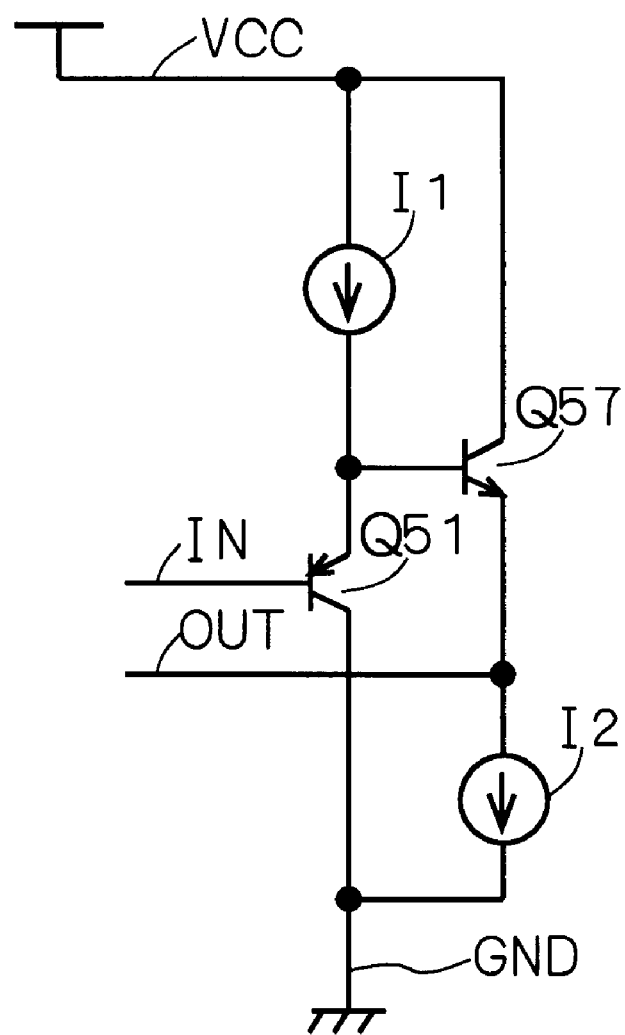

BUFFER CIRCUIT AND HOLD CIRCUIT

BACKGROUND OF THE INVENTION

1. Field of the Invention

The present invention relates to buffer circuits and hold circuits using them, and particularly to an improvement for reducing the offset voltage between the input and output in a wide range of output current.

2. Description of the Background Art

Buffer circuits are often used in electronic circuits performing various signal processings using voltage signals. The object of the buffer circuits is to transfer a voltage signal as it is without amplification, and particularly it is to transfer the same voltage signal with a reduced impedance. Accordingly, the buffer circuit is often connected to the output of a voltage signal generating portion which is a circuit portion for generating a voltage signal when the voltage signal generating portion has a high output impedance.

When another circuit is directly connected to the output of a voltage signal generating portion having a high output impedance, the voltage signal may vary because of the effect of the input impedance of the connected circuit. Since the buffer circuit receives a voltage signal with a high input impedance and outputs the received voltage signal with a low output impedance without distorting the voltage signal, the above-mentioned problem can be solved by interposing it in the transmission path of the voltage signal between the voltage signal generating portion and the other circuit.

While the buffer circuits are constructed as negative feedback circuits using operational amplifiers in some applications, they may be constructed as a simple circuit as shown in FIG. 19 in other examples. The buffer circuit shown in FIG. 19 is advantageous for its simple structure. In this buffer circuit, a voltage signal received as an input signal is applied to the base electrode of a pnp-type transistor Q51 through an input signal line IN and a voltage signal as an output signal is outputted through an output signal line OUT connected to the connection between the emitter electrode of an npn-type transistor Q57 and a constant current source I2.

The transistor Q51 has its emitter electrode connected to the base electrode of the transistor Q57 and also to the higher-potential power-supply line VCC through a constant current source I1. The transistor Q51 has its collector electrode connected to the ground-potential power-supply line GND. The transistor Q57 has its emitter electrode connected to the ground-potential power-supply line GND through the constant current source I2 and its collector electrode connected to the higher-potential power-supply line VCC.

The constant current source I1 supplies an emitter current to the transistor Q51, so that the potential of the emitter electrode of the transistor Q51 is higher than the potential of its base electrode. The emitter-base voltage $V_{EB}$ corresponding to the potential difference between them is given by the equation 1 below.

$$V_{EB} = kT/q \cdot \ln(Ic/Is) \qquad \text{Eq.1}$$

Where k is the Boltzmann's constant, T is the absolute temperature (K), q is the electron charge, Ic is the collector current, and Is is the saturation current peculiar to the transistor. According to the equation 1, the emitter-base voltage $V_{EB}$ is uniquely determined by the collector current Ic, but it does not vary largely even if the collector current Ic varies, for it is represented by the logarithm function of the collector current Ic.

In this operating state, the base current is smaller than the emitter current by the current amplification factor of the transistor because of the current amplifying action of the transistor. Since a lateral pnp-type transistor used in a semiconductor integrated circuit usually has a current amplification factor expressed in tens, a variation in the emitter current is attenuated by a factor of tens when it appears in the base current. The voltage variation is approximately equal between the base electrode and the emitter electrode since the emitter-base voltage $V_{EB}$ is approximately constant as shown above.

Accordingly, the ratio of the voltage variation to current variation of the emitter electrode, i.e. the impedance of the emitter electrode, is lower than the ratio of the voltage variation to current variation of the base electrode, i.e. than the impedance of the base electrode, approximately by the current amplification factor. That is to say, using the base electrode as the input and the emitter electrode as the output allows the circuit to receive the voltage signal with a high input impedance and output it with a low output impedance.

However, generally, the emitter-base voltage $V_{EB}$ of a transistor has a magnitude of about 0.6 to 0.7 V at room temperature. Accordingly, when a buffer circuit is formed by only a single stage of transistor, a voltage difference corresponding to the emitter-base voltage $V_{EB}$ occurs as an offset voltage between the input signal and the output signal, and then the buffer circuit cannot provide its function of transferring the voltage signal unchanged.

For the purpose of reducing the offset voltage, the buffer circuit of FIG. 19 includes the circuit part in the second stage (output stage) including the transistor Q57 as well as the circuit part in the first stage (input stage) including the transistor Q51. Then the emitter-base voltage $V_{EB}$ of the transistor Q51 is canceled by the emitter-base voltage $V_{EB}$ of the transistor Q57, and then the potential difference between the voltage signal input to the input signal line IN and the voltage signal output to the output signal line OUT, i.e. the offset voltage of the buffer circuit, can be reduced.

In the buffer circuit of FIG. 19, however, the two transistors are of different conductivity types: the transistor Q51 is pnp type and the transistor Q57 is npn type. It is not easy to set the emitter-base voltages $V_{EB}$ equal between transistors of different conductivity types. Particularly, it is further difficult to make the emitter-base voltages $V_{EB}$ of the two transistors coincide with each other in a wide range of output current to cancel the offset voltage, since the collector current of the transistor Q57 in the output stage varies in accordance with a variation in the current outputted through the output signal line OUT, i.e. a variation in the output current.

SUMMARY OF THE INVENTION

According to a first aspect of the invention, a buffer circuit comprises: a first transistor having a first main electrode, a second main electrode, and a control electrode, a second transistor of the same conductivity type as the first transistor having a first main electrode, a second main electrode, and a control electrode, the first and second transistors having, a size ratio of m:n (m, n=positive real numbers); a first power supply line connected to the second main electrode of the first transistor; a third transistor having its first main electrode connected to the first main electrodes of the first and second transistors and its control electrode connected to the control electrode of the second transistor, the third transistor having the same conductivity type as the second transistor and having a size ratio of 1/n times with respect to the second transistor; a first current mirror circuit connected to the second main electrode of the third transistor and the first power supply line and outputting a current which is p times (p=a positive real number) a main current of the third transistor; a second power supply line; and a second current mirror circuit connected to the first main electrodes of the first to third transistors, the first current mirror circuit and the second power supply line and supplying to the first main electrodes of the first to third transistors a current which is (M+n+1)/p times the current outputted from the first current mirror circuit.

Preferably, according to a second aspect of the invention, in the buffer circuit, the second current mirror circuit comprises a fourth transistor having its first main electrode connected to the second power supply line and its second main electrode connected to the first main electrodes of the first to third transistors, and a fifth transistor having its first main electrode connected to the second power supply line and its second main electrode and its control electrode connected to the first current mirror circuit and the control electrode of the fourth transistor, the fifth transistor having the same conductivity type as the fourth transistor and having a size ratio of p/(m+n+1) times with respect to the fourth transistor.

Preferably, according to a third aspect of the invention, in the buffer circuit, the first current mirror circuit comprises a sixth transistor having its first main electrode connected to the first power supply line and its second main electrode and its control electrode connected to the second main electrode of the third transistor, and a seventh transistor having its first main electrode connected to the first power supply line, its second main electrode connected to the second current mirror circuit, and its control electrode connected to the control electrode and the second main electrode of the sixth transistor, the seventh transistor having the same conductivity type as the sixth transistor and having a size ratio of p times with respect to the sixth transistor.

Preferably, according to a fourth aspect of the invention, the buffer circuit further comprises a starting circuit for causing the first to third transistors to change from a cut-off state to a conductive state when a voltage is applied between the first and second power supply lines.

Preferably, according to a fifth aspect of the invention, the buffer circuit further comprises a first resistor element having its one end connected to the first power supply line, and an eighth transistor having its first main electrode connected to the other end of the first resistor element, its second main electrode connected to the second power supply line, and its control electrode connected to the control electrode of the fourth transistor.

Preferably, according to a sixth aspect of the invention, the buffer circuit further comprises a starting circuit connected to the control electrode of the first transistor, the control electrode of the second transistor and the control electrode of the fourth transistor, for driving the control electrode of the fourth transistor in such a direction that the current of the fourth transistor increases only when a potential difference between the control electrode of the first transistor and the control electrode of the second transistor exceeds a reference value.

Preferably, according to a seventh aspect of the invention, in the buffer circuit, the starting circuit comprises a ninth transistor having its first main electrode connected to the second main electrode of the second transistor, its control electrode connected to the control electrode of the first transistor, and its second main electrode connected to the control electrode of the fourth transistor.

Preferably, according to an eighth aspect of the invention, the buffer circuit further comprises a second resistor element having its one end connected to the first power supply line, a tenth transistor having its first main electrode connected to the second power supply line, its control electrode connected to the control electrode of the fourth transistor, and its second main electrode connected to the other end of the second resistor element, and having the same conductivity type as the fourth transistor, an eleventh transistor having its first main electrode connected to the other end of the second resistor element and its second main electrode connected to the control electrode of the fourth transistor, and a circuit for holding constant the potential difference between a control electrode of the eleventh transistor and the first power supply line.

Preferably, according to a ninth aspect of the invention, the buffer circuit further comprises a twelfth transistor having its first main electrode connected to the second main electrode and the control electrode of the first transistor and its second main electrode connected to the first power supply line, and having the same conductivity type as the first transistor, and a thirteenth transistor having its first main electrode connected to the second main electrode and the control electrode of the second transistor and its second main electrode connected to its control electrode, the thirteenth transistor having the same conductivity type as the twelfth transistor and having a size ratio of n/m times with respect to the twelfth transistor.

Preferably, according to a tenth aspect of the invention, the buffer circuit further comprises a fourteenth transistor having its first main electrode connected to the first main electrodes of the first to third transistors and its second main electrode connected to its control electrode, the fourteenth transistor having the same conductivity type as the first transistor and having a size ratio of one times with respect to the first transistor, and a fifteenth transistor having its first main electrode connected to the second main electrode of the fourteenth transistor and its second main electrode connected to the first power supply line, the fifteenth transistor having the same conductivity type as the twelfth transistor and having a size ratio of one times with respect to the twelfth transistor.

According to an eleventh aspect of the invention, a buffer circuit comprises: a first buffer circuit structurally identical to the buffer circuit of any of the first to eighth aspects and a second buffer circuit structurally identical to the buffer circuit of the ninth or tenth aspect, wherein between the first and second buffer circuits, the first power supply lines are connected to each other, the second power supply lines are connected to each other, the control electrode of the first transistor is connected to the control electrode of the twelfth transistor, and the second main electrode of the second transistor is connected to the second main electrode of the thirteenth transistor.

According to a twelfth aspect of the invention, a hold circuit comprises: the buffer circuit of any of the first to eight aspects and a capacitance element having its one end connected to the second main electrode of the second transistor and its other end connected to any of the first power supply line, the second power supply line, and a stable potential line holding a certain potential with respect to the first and second power supply lines.

According to a thirteenth aspect of the invention, a hold circuit comprises: the buffer circuit of the ninth or tenth aspect and a capacitance element having its one end connected to the second main electrode of the thirteenth transistor and its other end connected to any of the first power supply line, the second power supply line, and a stable potential line holding a certain potential with respect to the first and second power supply lines.

According to the circuit of the first aspect, the first and second current mirror circuits serve to supply a current (m+n+1) times the current flowing in the third transistor to the first main electrodes of the first to third transistors. Accordingly, since the ratio between the currents flowing in the first and second transistors is the same as their size ratio m:n, the potential differences between the first main electrode and the control electrode are equal between the first and second transistors. Therefore a voltage signal inputted to the control electrode of the first transistor is outputted from the second main electrode of the second transistor without offset. That is to say, it is possible to realize a buffer circuit which can reduce the offset voltage between the input and output in a wide range of output current with a simple circuit configuration.

According to the circuit of the second aspect, since the second current mirror circuit is composed of two transistor elements, the circuit configuration is simple and the current ratio is accurate.

According to the circuit of the third aspect, since the first current mirror circuit is composed of two transistor elements, the circuit configuration is simple and the current ratio is accurate.

According to the circuit of the fourth aspect, the starting circuit allows the transistor elements to certainly leave a cut-off state to start a normal operation after a power-supply voltage is supplied.

According to the circuit of the fifth aspect, the eighth transistor and the first resistor element function as a starting circuit, so that the transistor elements can certainly leave a cut-off state to start a normal operation after a power-supply voltage is supplied. Further, the circuit configuration can be simple because the starting circuit is composed of two elements.

According to the circuit of the sixth aspect, the starting circuit drives the fourth transistor in such a direction as to increase its current only when the potential difference between the control electrodes of the first and second transistors exceeds a reference value. Hence, while the buffer circuit is maintaining the normal operation state, the current supplied to the first to third transistors is not disturbed by the starting circuit. This prevents occurrence of even a small offset due to the starting circuit.

According to the circuit of the seventh aspect, since the starting circuit is formed by a single transistor, the circuit structure is simple.

According to the circuit of the eighth aspect, the tenth transistor serves so that a current depending on the potential difference between the first main electrode and the control electrode of the fourth transistor flows to the second resistor element. Since the potential of the control electrode of the eleventh transistor is kept constant, the main current flowing in the eleventh transistor decreases as the voltage drop across the second resistor element becomes larger. Accordingly, the interference on the fourth transistor by the starting circuit is weakened while the buffer circuit is normally operating, which alleviates the occurrence of a small offset caused by the starting circuit.

According to the circuit of the ninth aspect, a voltage signal inputted to the control electrode of the twelfth transistor is outputted from the second main electrode of the thirteenth transistor without offset. Furthermore, even if the input voltage signal comes excessively close to the potential of the first power supply line, the buffer circuit can maintain the normal operation because of the potential difference between the first main electrode and the control electrode of the twelfth and thirteenth transistors.

According to the circuit of the tenth aspect, the buffer circuit includes the fourteenth and fifteenth transistors. When a certain voltage is inputted as a clamp signal to the control electrode of the fifteenth transistor, the output voltage can be clamped to the clamp voltage.

According to the circuit of the eleventh aspect, the first buffer circuit which can maintain the normal operation even if the input voltage comes closer to the potential of the second power supply line and the second buffer circuit which can maintain the normal operation even if it comes close to the potential of the first power supply line are connected in parallel, which enables normal buffer operation in a wide range of input voltage.

According to the circuit of the twelfth aspect, the circuit utilizes the buffer circuit of the present invention, which realizes a hold circuit with reduced offset voltage and with a capacitance element having a large capacitance.

According to the circuit of the thirteenth aspect, the circuit utilizes the buffer circuit of the present invention, which realizes a hold circuit with reduced offset voltage and with a capacitance element having a large capacitance.

The present invention has been made to solve the above-mentioned problem of conventional devices, and an object is to obtain a buffer circuit which can reduce the offset voltage between the input and output in a wide range of output current with a simple structure, and to provide a hold circuit using this buffer circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram showing a buffer circuit according to a third preferred embodiment.

FIG. 6 is a circuit diagram showing a buffer circuit according to a fourth preferred embodiment.

FIGS. 10 to 12 are circuit diagrams showing part of buffer circuits according to an eighth preferred embodiment.

FIG. 13 is a circuit diagram showing a buffer circuit according to a ninth preferred embodiment.

FIG. 14 is a circuit diagram showing an example of the starting circuit of FIG. 13.

FIG. 19 is a circuit diagram showing a conventional buffer circuit.

DESCRIPTION OF THE PREFERRED EMBODIMENTS

1. First Preferred Embodiment

Figure 1:
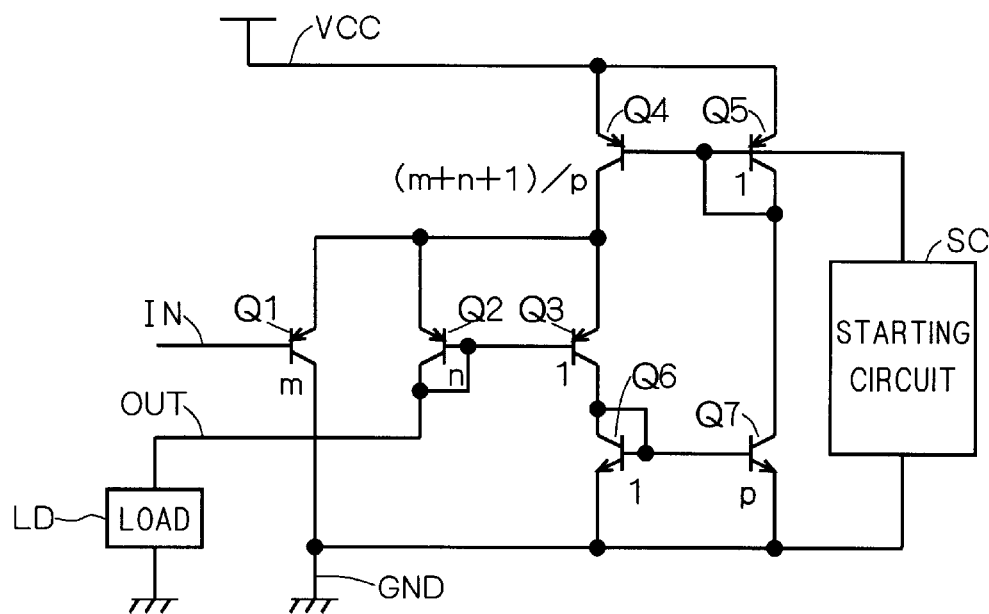
FIG. 1 is a circuit diagram showing a buffer circuit according to a first preferred embodiment.

FIG. 1 is a circuit diagram showing the structure of a buffer circuit according to a first preferred embodiment. FIG. 1 also shows an external load LD connected to the output signal line OUT of the buffer circuit. This buffer circuit includes bipolar pnp-type transistors Q1, Q2, Q3, Q4 and Q5, bipolar npn-type transistors Q6 and Q7, and a starting circuit SC.

In this buffer circuit, a voltage signal received as an input signal is applied to the base electrode of the transistor Q1 through the input signal line IN and a voltage signal as an output signal is outputted through the output signal line OUT connected to the connection between the collector electrode and the base electrode of the transistor Q2. The transistor Q1 has its collector electrode connected to the ground-potential power-supply line GND and its emitter electrode connected to the emitter electrodes of the transistors Q2 and Q3 in common. The transistors Q2 and Q3 form a current mirror circuit with their emitter electrodes connected to each other and their base electrodes connected to each other.

The transistor Q3 has its collector electrode connected to the connection between the collector electrode and the base electrode of the transistor Q6. The transistors Q6 and Q7 form a current mirror circuit with their emitter electrodes connected to each other and their base electrodes connected to each other.

The transistors Q1, Q2 and Q3 have their respective emitter electrodes connected to the collector electrode of the transistor Q4. The transistor Q7 has its collector electrode connected to the connection between the collector electrode and the base electrode of the transistor Q5. The transistors Q4 and Q5 form a current mirror circuit with their emitter electrodes connected to each other and their base electrodes connected to each other. The emitter electrodes of the transistors Q4 and Q5 are connected to the higher-potential power-supply line VCC.

The starting circuit SC has its input connected to the base electrodes of the transistors Q4 and Q5. The starting circuit SC serves to supply a small current to the base electrodes of the transistors Q4 and Q5.

The transistors are adjusted in some groups so that their transistor sizes are in given ratios (the ratio is referred to as "size ratio"). Specifically, the size ratio among the transistors Q1, Q2 and Q3 is set at m:n:1, the size ratio between the transistors Q6 and Q7 is set at 1:p, and the size ratio between the transistors Q4 and Q5 is set at $\{(m+n+1)/p\}:1$. The variables m, n and p are all positive real numbers.

The statement that two bipolar transistors are in a size ratio of a:b means that the two transistors are formed so that the ratio between the collector currents with respect to the same emitter-base voltage $V_{EB}$ is a:b. Specific examples of setting of the size ratio of bipolar transistors will be described later.

The buffer circuit of FIG. 1 thus constructed operates as shown below. When all transistors are normally operating without saturating, the current outputted through the output signal line OUT, i.e. the output current Iout, is approximately equal to the emitter current of the transistor Q2. Since the transistors Q2 and Q3 form a current mirror circuit, the ratio between their collector currents coincides with the size ratio n:1. Accordingly the collector current Ic(Q3) of the transistor Q3 is given by the equation 2 below.

$$Ic(Q3) = Iout \div n \qquad \text{Eq.2}$$

Similarly, the ratio between the collector currents of the transistors Q6 and Q7 forming a current mirror circuit corresponds to the size ratio 1:p. Accordingly the collector current Ic(Q7) of the transistor Q7 is given by the equation 3 below.

$$Ic(Q7) = (Iout \div n) \times p \qquad \text{Eq.3}$$

Further, the ratio between the collector currents of the transistors Q4 and Q5 forming a current mirror circuit corresponds to the size ratio (m+n+1)/p:1. Accordingly the collector current Ic(Q4) of the transistor Q4 is given by the equation 4 below.

$$Ic(Q4) = \{(Iout \div n) \times p\} \times \{(m+n+1) \div p\} = Iout \times (m+n+1) \div n \qquad \text{Eq.4}$$

As a result, the emitter current Ie(Q1) of the transistor Q1 is given as the collector current of the transistor Q4 minus the emitter current of the transistor Q2 and the emitter current of the transistor Q3, as shown by the equation 5 below.

$$\begin{aligned} Ie(Q1) &= Ic(Q4) - Ie(Q2) - Ie(Q3) \\ &\approx \{Iout \times (m+n+1) \div n\} - \{Iout\} - \{Iout \div n\} \\ &= Iout \times m \div n \end{aligned} \qquad \text{Eq. 5}$$

The emitter-base voltage Veb(Q1) of the transistor Q1 and the emitter-base voltage Veb(Q2) of the transistor Q2 can be compared through the emitter current flowing per unit transistor, which are given by the equation 6 and equation 7 below, respectively.

$$\begin{aligned} Veb(Q1) &= kT/q \cdot \ln(Ie(Q1)/Is \cdot m)) \\ &= kT/q \cdot \ln(Iout/Is \cdot n)) \end{aligned} \qquad \text{Eq. 6}$$

$$\begin{aligned} Veb(Q2) &= kT/q \cdot \ln(Ie(Q2)/Is \cdot n)) \\ &= kT/q \cdot \ln(Iout/Is \cdot n)) \end{aligned} \qquad \text{Eq. 7}$$

As shown by the equations 6 and 7, the emitter-base voltages of the transistor Q1 and transistor Q2 are both represented as a function of the output current Iout and they are at the same value. Accordingly, the relation between the output voltage Vout and the input voltage Vin can be given by the equation 8 below.

$$\begin{aligned} Vout &= Vin + Veb(Q1) - Veb(Q2) \\ &= Vin \end{aligned} \qquad \text{Eq. 8}$$

That is to say, the offset voltage can be suppressed independently of the value of the output current Iout, i.e., in a wide range of the output current Iout. Particularly, when the buffer circuit is fabricated as an integrated circuit in a single semiconductor substrate, the size ratios of certain transistors can be easily set at given ratios.

The buffer circuit of FIG. 1 which forms a kind of feedback circuit has two stable states when the power supply is on. The two states include the normal operating state described above and a halt state. All transistors are in the cut-off state in the halt state. The starting circuit SC serves to remove the halt state and make a transition to the normal operating state when the power supply is turned on.

Figure 2:
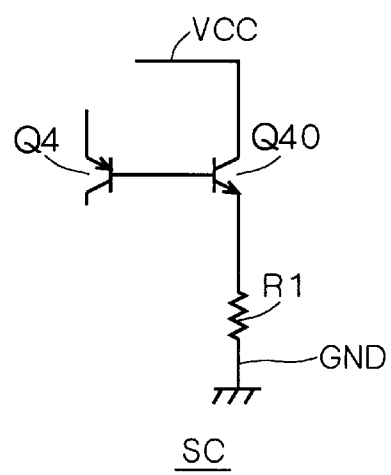
FIG. 2 is a circuit diagram showing an example of the starting circuit of FIG. 1.

FIG. 2 is a circuit diagram showing an example of the starting circuit SC. This starting circuit SC includes a series circuit of a bipolar npn-type transistor Q40 and a resistor element R1 interposed between the higher-potential power-supply line VCC and the ground-potential power-supply line GND. The transistor Q40 has its base electrode connected to the base electrodes of the transistors Q4 and Q5. A small base current determined by the resistance value of the resistor element R1 and the current amplification factor of the transistor Q40 flows in the transistor Q40. This base current is supplied to the transistor Q4 as its base current. Hence, after the power supply is turned on, the transistor Q4 can leave the cur-off state and enter the normal operation state. When the transistor Q4 gets out of the cut-off state, other transistors also go into the normal operation. Thus the stable operating state is maintained.

The current flowing to the starting circuit SC, or the current flowing from the base electrode of the transistor Q4 to the base electrode of the transistor Q40, is preferably controlled as low as possible in a range sufficient to turn on the transistor Q4. This prevents a slight difference from occurring between the two emitter-base voltages shown by the equations 6 and 7 which will occur when the base current of the transistor Q4 branches off into the starting circuit SC.

2. Second Preferred Embodiment

Figure 3:
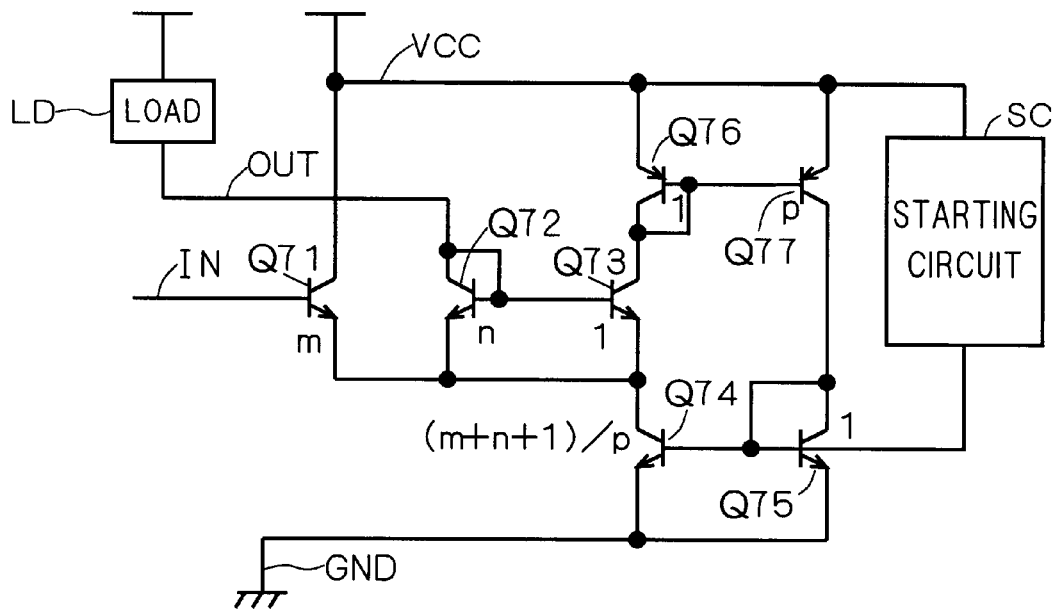
FIG. 3 is a circuit diagram showing a buffer circuit according to a second preferred embodiment.

FIG. 3 is a circuit diagram showing the structure of a buffer circuit according to a second preferred embodiment. In the drawings referred to below, the same parts as those in the device of the first preferred embodiment shown in FIGS. 1 and 2 and corresponding parts (elements having the same functions) are shown at the same reference characters and they are not described in detail again. FIG. 3 also shows an external load LD connected to the output signal line OUT of the buffer circuit. This buffer circuit includes bipolar npn-type transistors Q71, Q72, Q73, Q74 and Q75, bipolar pnp-type transistors Q76 and Q77, and a starting circuit SC. The size ratio among the transistors Q71, Q72 and Q73 is set at m:n:1, the size ratio between the transistors Q76 and Q77 is set at 1:p, and the size ratio between the transistors Q74 and Q75 is set at $\{(m+n+1)/p\}:1$.

As is clear from FIG. 3, the buffer circuit of this preferred embodiment is constructed equivalent to the buffer circuit of the first preferred embodiment shown in FIG. 1 except that the conductivity types of all transistors are reversed and that the higher-potential power-supply line VCC and the ground-potential power-supply line GND are replaced by each other. In other words, the buffer circuit of FIG. 3 and the buffer circuit of FIG. 1 are constructed in a symmetrical relation (that is, in a complementary relation).

Figure 4:
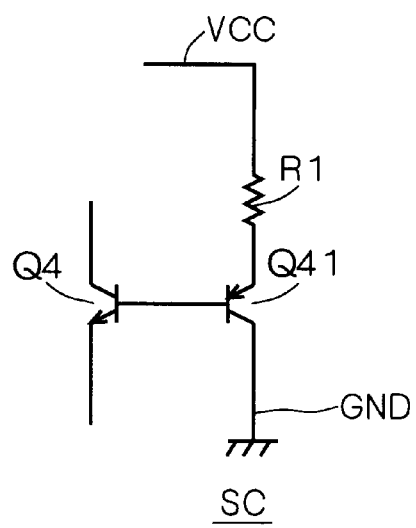
FIG. 4 is a circuit diagram showing an example of the starting circuit of FIG. 3.

As shown in FIG. 4, for example, the starting circuit SC of FIG. 3 also has a series circuit of a bipolar pnp-type transistor Q41 and the resistor element R1 interposed between the higher-potential power-supply line VCC and the ground-potential power-supply line GND. The base electrode of the transistor Q41 is connected to the base electrodes of the transistors Q74 and Q75. That is to say, the starting circuit SC of FIG. 4 and the starting circuit SC of FIG. 2 are constructed in a symmetrical relation as well.

The buffer circuit of the first preferred embodiment shown in FIG. 1 can only discharge the output current Iout from the collector electrode of the transistor Q2 to the output signal line OUT, but it cannot draw in. Hence this buffer circuit is suited to drive a load LD interposed between the output signal line OUT and the ground-potential power-supply line GND as shown in FIG. 1, for example. In contrast, the buffer circuit of the second preferred embodiment shown in FIG. 3 can only draw in the output current Iout from the output signal line OUT to the collector electrode of the transistor Q72, and it cannot discharge. Accordingly, this buffer circuit is suited to drive a load LD interposed between the output signal line OUT and the higher-potential power-supply line VCC as shown in FIG. 3, for example. The buffer circuits of the first and second preferred embodiments can thus be used depending on the application to adapt to loads LD of every type.

3. Third Preferred Embodiment

FIG. 5 is a circuit diagram showing the structure of a buffer circuit according to a third preferred embodiment. This buffer circuit characteristically differs from the buffer circuit of the first preferred embodiment shown in FIG. 1 in that a bipolar pnp-type transistor Q9 is interposed between the transistor Q1 and the input signal line IN and a bipolar pnp-type transistor Q10 is interposed between the transistor Q2 and the output signal line OUT.

The transistor Q9 has its emitter electrode connected to the connection between the collector electrode and the base electrode of the transistor Q1, its base electrode connected to the input signal line IN, and its collector electrode connected to the ground-potential power-supply line GND. The transistor Q10 has its emitter electrode connected to the connection between the collector electrode and the base electrode of the transistor Q2 and its base electrode and collector electrode connected to the output signal line OUT in common. The size ratio between the transistors Q9 and Q10 is set at m:n, as well as the size ratio between the transistors Q1 and Q2. The starting circuit SC is constructed as the circuit shown in FIG. 2, for example.

In the buffer circuit of the first preferred embodiment, when the input voltage comes excessively close to the ground potential (i.e. the potential of the ground-potential power-supply line GND), then the emitter potential of the transistor Q1 becomes lower and as a result the emitter potential of the transistor Q3 also becomes lower. At this time, the transistor Q3 goes in a saturation state and a sufficient current cannot be supplied to the transistor Q6, and then the normal feedback operation shown in the first preferred embodiment cannot be maintained.

In contrast, as compared with the buffer circuit of the first preferred embodiment, the emitter potential of the transistor Q1 can be higher by the emitter-base voltage of the transistor Q9 in the buffer circuit of the third preferred embodiment shown in FIG. 5. Thus, even if the input voltage is zero with respect to the ground potential, the emitter potential of the transistor Q3 can be maintained sufficiently high so that the normal feedback operation can be maintained.

The size ratio between the transistors Q9 and Q10 is set at the same ratio as that between the transistors Q1 and Q2, so that the emitter-base voltages are kept equal between the transistors Q9 and Q10 in a wide range of the output current Iout. Accordingly, like the buffer circuit of the first preferred embodiment, this circuit can cancel the offset voltage in a wide range of the output current Iout.

4. Fourth Preferred Embodiment

FIG. 6 is a circuit diagram showing the structure of a buffer circuit according to a fourth preferred embodiment.

This buffer circuit characteristically differs from the buffer circuit of the third preferred embodiment shown in FIG. 5 in that a clamp circuit having bipolar pnp-type transistors Q11 and Q12 is interposed between the emitter electrodes of the transistors Q1, Q2 and Q3 and the ground-potential power-supply line GND.

The transistor Q12 has its base electrode connected to the clamp input signal line CLP. The transistor Q12 has its collector electrode connected to the ground-potential power-supply line GND and its emitter electrode connected to the connection between the collector electrode and the base electrode of the transistor Q11. The transistor Q11 has its emitter electrode connected to the emitter electrodes of the transistors Q1, Q2 and Q3 in common. The size ratio between the transistors Q1 and Q11 is set at 1:1 and the size ratio between the transistors Q9 and Q12 is set at 1:1, as well.

In the buffer circuit of the fourth preferred embodiment constructed as shown in FIG. 6, when the input voltage inputted to the input signal line IN is not higher than the clamp voltage inputted to the clamp input signal line CLP, the transistors Q11 and Q12 are in a cut-off state and the clamp circuit does not affect the operation of the buffer circuit. In this case, the buffer circuit of FIG. 6 operates in the same way as the buffer circuit of FIG. 5 and an output voltage equal to the input voltage is obtained from the output signal line OUT.

On the other hand, when the input voltage increases over the clamp voltage, the transistors Q11 and Q12 become conductive and the emitter potential common among the transistors Q1, Q2, Q3 and Q11 is limited to a certain value corresponding to the clamp voltage. In this case, the transistors Q1 and Q9 go into a cut-off state, so that the buffer circuit of FIG. 6 operates just as the buffer circuit of FIG. 5 operates when an input voltage equal to the clamp voltage is inputted to the input signal line IN. As a result, an output voltage equal to the clamp voltage is outputted from the output signal line OUT. In this way, in the buffer circuit of FIG. 6, the output voltage is accurately clamped at the clamp voltage even if the input voltage increases over a certain limit.

5. Fifth Preferred Embodiment

Figure 7:
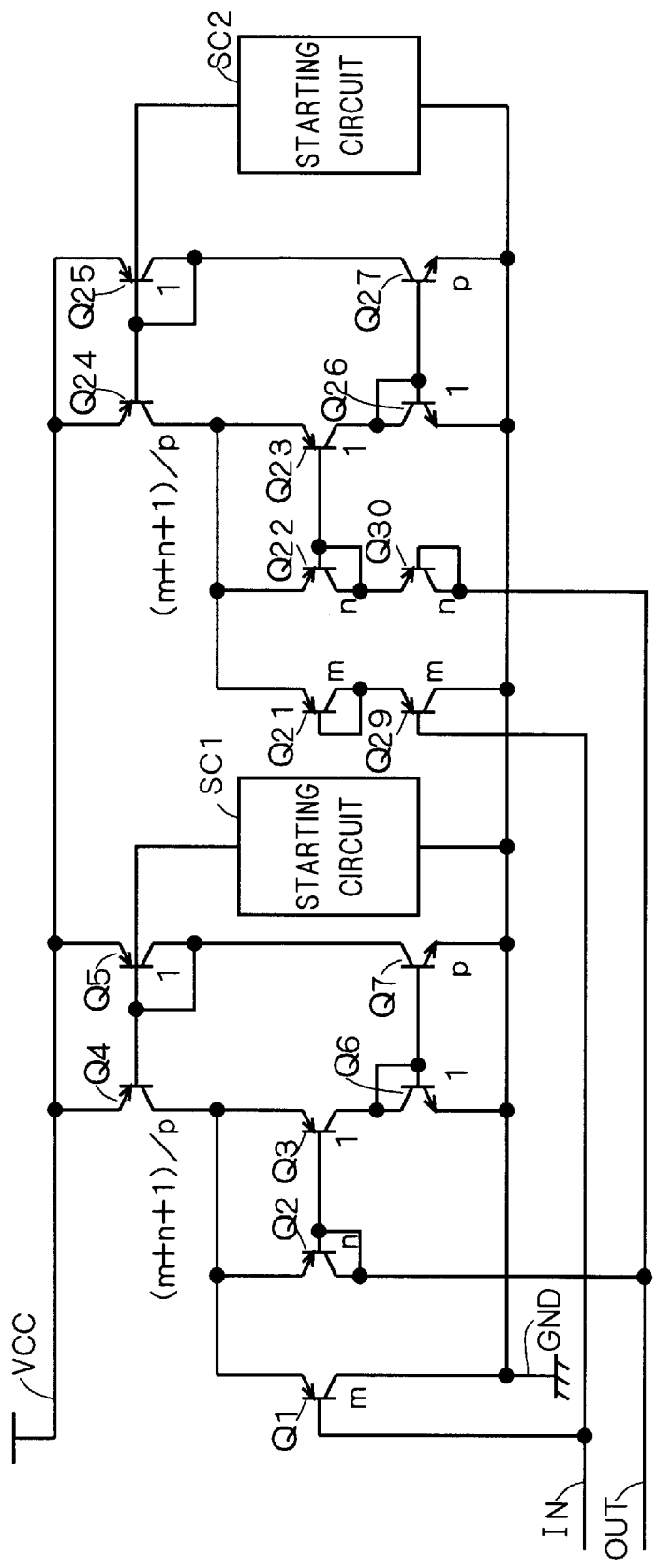
FIG. 7 is a circuit diagram showing a buffer circuit according to a fifth preferred embodiment.

FIG. 7 is a circuit diagram showing the structure of a buffer circuit according to a fifth preferred embodiment. This buffer circuit has a circuit configuration which can be obtained by connecting in parallel the buffer circuit of the first preferred embodiment shown in FIG. 1 (the transistors Q1 to Q7 and the starting circuit SC1) and the buffer circuit of the third preferred embodiment shown in FIG. 5 (the transistors Q21 to Q30 and the starting circuit SC2) with the input signal line IN, output signal line OUT, higher-potential power-supply line VCC and ground-potential power-supply line GND shared between the two circuits. The transistors Q21 to Q30 correspond to the transistors Q1 to Q10 shown in FIG. 5, respectively. The starting circuit SC1 corresponds to the starting circuit SC of FIG. 1 and the starting circuit SC2 corresponds to the starting circuit SC of FIG. 5. The starting circuits SC1 and SC2 may be identical in structure.

While the buffer circuit of the third preferred embodiment shown in FIG. 5 exhibits an improved characteristic when the input voltage is excessively close to the ground potential as compared with the buffer circuit of the first preferred embodiment shown in FIG. 1, it cannot maintain normal feedback operation when the input voltage is excessively close to the higher power-supply potential (i.e. the potential of the higher-potential power-supply line VCC). That is to say, while the range of the input voltage which is effective to maintain normal operation is shifted to higher potentials in the buffer circuit of the first preferred embodiment, it is shifted to lower potentials in the buffer circuit of the third preferred embodiment.

Since the buffer circuit of the fifth preferred embodiment shown in FIG. 7 contains the two buffer circuits connected in parallel, it can output an output voltage equal to the input voltage from the output signal line OUT as long as either of the buffer circuits normally operates. Thus, the range of effective input voltage is enlarged to the union of the effective input voltage ranges of the two buffer circuits. As a result, the offset voltage can be suppressed in a wider range of input voltage from the ground potential to the higher power-supply potential.

6. Sixth Preferred Embodiment

Figure 8:
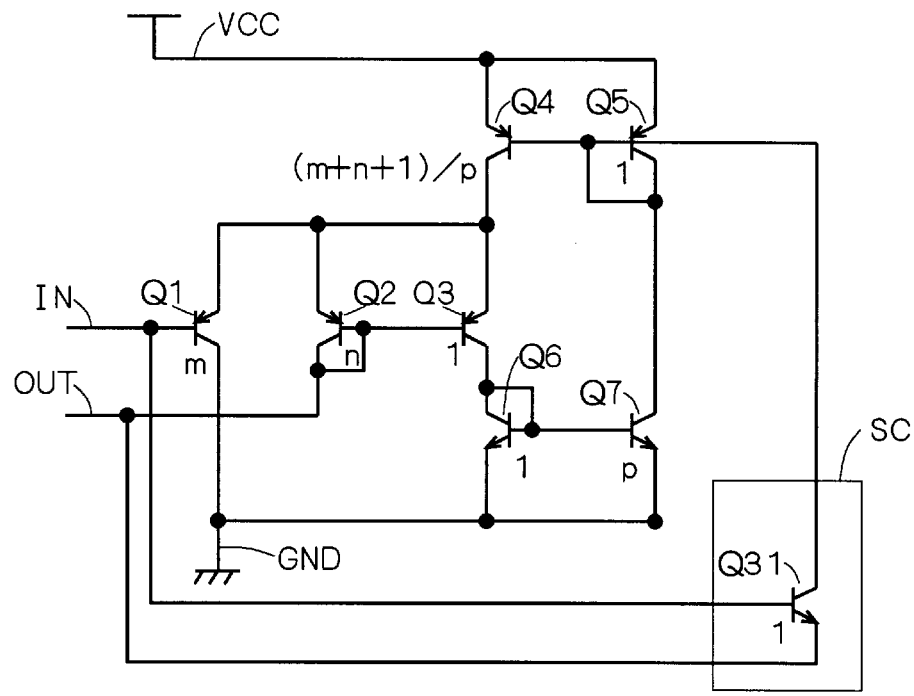
FIG. 8 is a circuit diagram showing a buffer circuit according to a sixth preferred embodiment.

FIG. 8 is a circuit diagram showing the structure of a buffer circuit according to a sixth preferred embodiment. This buffer circuit characteristically differs from the buffer circuit of the first preferred embodiment in that the starting circuit SC is constructed to supply the base current to the transistor Q4 only when the difference between the input voltage and the output voltage, or the offset voltage, is large over a certain value. Specifically, the starting circuit SC of FIG. 8 includes a bipolar npn-type transistor Q31, which has its base electrode connected to the input signal line IN, its emitter electrode connected to the output signal line OUT, and its collector electrode connected to the base electrodes of the transistors Q4 and Q5.

The starting circuit SC of the first preferred embodiment shown in FIG. 2 is constructed in such a way that it draws in small current from the base electrode of the transistor Q4 even when the buffer circuit is performing normal feedback operation. This causes the collector current of the transistor Q4 to increase. Since most part of the increase in the collector current of the transistor Q4 contributes to an increase in the emitter current of the transistor Q1, the emitter current of the transistor Q1 becomes larger than the emitter current of the transistor Q2. As a result, the emitter-base voltage of the transistor Q1 becomes larger than that of the transistor Q2. The difference between the emitter-base voltages appears as the offset voltage of the buffer circuit. Particularly, the current of the starting circuit SC affects it more severely and then the offset voltage increases, as the output current Iout becomes smaller.

In the buffer circuit of the sixth preferred embodiment shown in FIG. 8, when a potential difference occurs between the input voltage and the output voltage and it exceeds the emitter-base voltage of the transistor Q31 (about 0.6 to 0.7 V at room temperature), then a collector current flows in the transistor Q31. This collector current is drawn out from the base electrode of the transistor Q4, so that a current corresponding to the operation of the current mirror circuit including the transistors Q4 and Q5 flows from the collector electrode of the transistor Q4. This operation allows the feedback circuit to switch from the halt state to the operating state, and the buffer circuit starts normal operation.

The potential difference between the input voltage and the output voltage is maintained at zero while the buffer circuit is operating normally, so that the emitter-base voltage of the transistor Q31 in the starting circuit SC is maintained at zero. Accordingly the current flowing in the starting circuit SC is zero after the buffer circuit enters the normal operating state. That is to say, it is possible to obtain the ideal characteristic that a high starting capability enough for driving can be obtained even when the resistance of the load LD connected to the output signal line OUT is small, while preventing generation of error current which causes the offset voltage in the normal operating state.

FIG. 8 shows an example in which the starting circuit SC has the npn-type transistor Q31. However, generally, other circuit configuration which draws in current from the base electrode of the transistor Q4 only when a predetermined or higher potential difference occurs between the input voltage and the output voltage can be adopted to provide the same effect.

7. Seventh Preferred Embodiment

Figure 9:
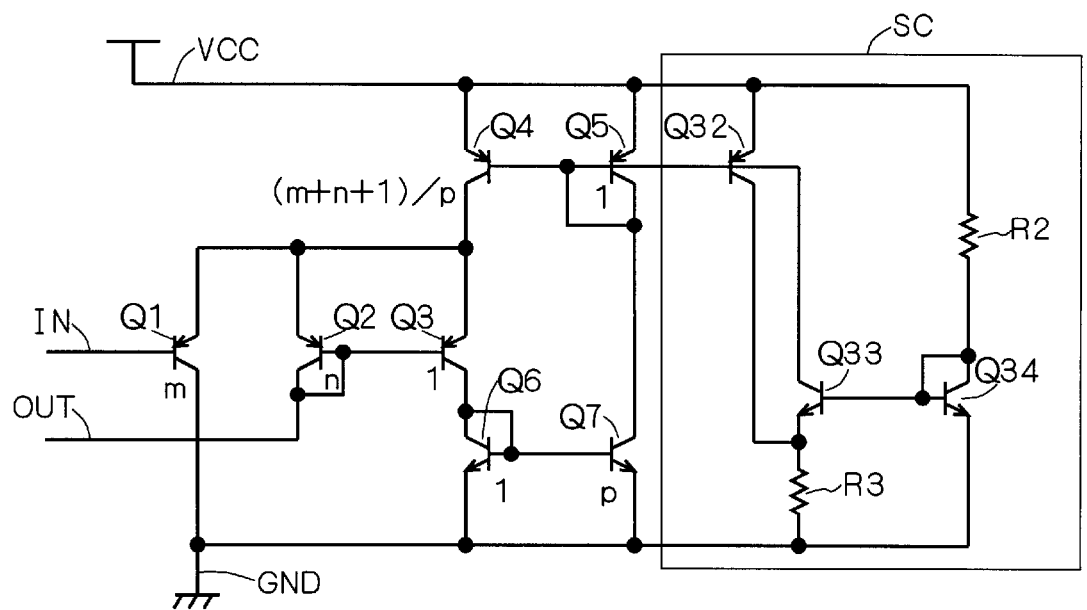
FIG. 9 is a circuit diagram showing a buffer circuit according to a seventh preferred embodiment.

FIG. 9 is a circuit diagram showing the structure of a buffer circuit according to a seventh preferred embodiment. This buffer circuit characteristically differs from the buffer circuit of the first preferred embodiment in that the starting circuit SC is constructed to restrict the magnitude of the base current supplied to the transistor Q4 at or under a certain value. The starting circuit SC of FIG. 9 includes a bipolar pnp-type transistor Q32, bipolar npn-type transistors Q33 and Q34, and resistor elements R2 and R3.

The transistor Q32 has its base electrode connected to the base electrodes of the transistors Q4 and Q5, its emitter electrode connected to the higher-potential power-supply line VCC and its collector electrode connected to one end of the resistor element R3 together with the emitter electrode of the transistor Q33. The other end of the resistor element R3 is connected to the ground-potential power-supply line GND. The transistor Q33 has its collector electrode connected to the base electrodes of the transistors Q4, Q5 and Q32 in common and its base electrode connected to the connection between the base electrode and the collector electrode of the transistor Q34. The transistor Q34 has its emitter electrode connected to the ground-potential power-supply line GND and its collector electrode connected to the higher-potential power-supply line VCC through the resistor element R2.

The starting circuit SC of FIG. 9 thus constructed operates as shown below. When the buffer circuit is in a halt state, the collector current of the transistor Q32 is zero. At this time, a collector current uniquely determined by the emitter-base voltage of the transistor Q34, the power-supply voltage and the resistance value of the resistor element R2 flows in the collector electrode of the transistor Q34. The transistors Q33 and Q34 form a current mirror circuit, so that the ratio between the collector currents of the transistors Q33 and Q34 is equal to the size ratio between the transistors Q33 and Q34 (1:1, for example).

However, since the resistor element R3 is connected to the emitter electrode of the transistor Q33, the collector currents are kept at the ratio of e.g. 1:1 only when the voltage drop across the resistor element R2 is sufficiently small. The ratio of the collector current of the transistor Q33 to the collector current of the transistor Q34 becomes smaller than the given ratio by the voltage drop caused by the current flowing through the resistor element R2.

The transistor Q33 draws out current as its collector current from the base electrode of the transistor Q4. This current functions as a starting current and hence the buffer circuit can start normal operation. When the collector current of the transistor Q4 increases, the collector current of the transistor Q32 connected to the base electrode of the transistor Q4 increases because of the operation of the current mirror circuit. The increase in the collector current of the transistor Q32 increases the voltage drop across the resistor element R3 which determines the starting current, which decreases the collector current of the transistor Q33. When the collector current of the transistor Q4 increases over a certain value, almost no starting current flows. As a result, the inconvenience that an error voltage occurs due to the starting circuit SC can be solved while the buffer circuit is maintaining the normal operation.

As described above, the buffer circuit of the seventh preferred embodiment is constructed so that the starting circuit SC detects part of the current flowing in the buffer circuit: it supplies the starting current when the detected current is smaller than a certain limit, and it restricts the starting circuit when the detected current is larger over the certain limit. This suppresses the error current which causes an offset current in the normal operating state.

The transistor Q34 and the resistor element R2 serve to keep the potential of the base electrode of the transistor Q33 constant, which can be replaced by another circuit which can keep the potential of the base electrode of the transistor Q33 constant.

8. Eighth Preferred Embodiment

A hold circuit can be formed in any of the buffer circuits of the first to seventh preferred embodiments by interposing a capacitance element between the output signal line OUT and a stable potential line. Hold circuit is a generic name of peak hold circuits and bottom hold circuits. FIGS. 10 to 12 are circuit diagrams showing part of hold circuits thus constructed.

In the examples shown in FIGS. 10 to 12, the capacitance element CC has its one end connected to the output signal line OUT. Its other end is connected to the ground-potential power-supply line GND in FIG. 10, and the end is connected to the higher-potential power-supply line VCC in the example shown in FIG. 11. That end of the capacitance element CC is not necessarily connected to the ground-potential power-supply line GND or the higher-potential power-supply line VCC, but it may generally be connected to a stable potential line STL which holds a constant voltage (including zero) with respect to the ground-potential power-supply line GND or the higher-potential power-supply line VCC as shown in FIG. 12.

When any of the buffer circuits of the first, third to seventh preferred embodiments is used, that is, when a buffer circuit which discharges the output current to the output signal line OUT is used, the hold circuits having the part shown in FIGS. 10 to 12 all function as a peak hold circuit. In contrast, when the buffer circuit of the second preferred embodiment is used, that is, when a buffer circuit which draws in the output current from the output signal line OUT is used, the hold circuits having the part shown in FIGS. 10 to 12 all function as a bottom hold circuit.

In this preferred embodiment, the use of the buffer circuits of the preferred embodiments in which the offset voltage is reduced in a wide range of output current realizes hold circuits with reduced offset voltage, with the capacitance element CC having a large capacitance.

9. Ninth Preferred Embodiment

While the buffer circuits of the first to seventh preferred embodiments use bipolar transistors, transistors of other type e.g., MOSFETs, may be used in place of the bipolar transistors. FIG. 13 is a circuit diagram showing an example of a buffer circuit using MOSFETs. The buffer circuit shown in FIG. 13 differs from the buffer circuit of the first preferred embodiment shown in FIG. 1 in that the pnp-type bipolar transistors Q1 to Q5 are replaced with n-channel MOSFETs Q81 to Q85 and the npn-type bipolar transistors Q6 and Q8 are replaced with p-channel MOSFETs Q86 and Q87.

For the starting circuit SC, the circuit shown in FIG. 14, which is constructed identical to the starting circuit SC of FIG. 2, can be used. The starting circuit SC shown in FIG. 8 or FIG. 9 may also be used, or a circuit formed by replacing the bipolar transistors with MOSFETs in the starting circuit of FIG. 8 or FIG. 9 may be used.

The circuit components are connected in such a manner that the gate electrodes, source electrodes, and drain electrodes of the MOSFETs correspond to the base electrodes, emitter electrodes and collector electrodes of the bipolar transistors, respectively. In correspondence with the buffer circuit of the first preferred embodiment, the size ratio among the transistors Q81, Q82 and Q83 is set at m:n:1, the size ratio between the transistors Q86 and Q87 is set at 1:p, and the size ratio between the transistors Q84 and Q85 is set at $\{(m+n+1)/p\}:1$.

The statement that two MOSFETs are in a size ratio of a:b means that the two MOSFETs are formed so that the ratio between their drain currents with respect to the same source-gate voltage is at a:b. That it to say, generally, when two transistors have a size ratio of a:b, the two transistors are formed so that the ratio between the main currents with respect to the same voltage between the first main electrode and control electrode is a:b. In other words, assuming an integer ratio A:B equal to the ratio a:b, two transistors having the size ratio a:b are equivalent in characteristics to transistors formed by connecting in parallel A unit transistors having the same characteristics and transistors formed by connecting in parallel B of such transistors. The parallel connection of transistors means a connection form in which the first main electrodes are connected to each other, the second main electrodes are connected to each other, and the control electrodes are connected to each other.

Like the buffer circuit shown in FIG. 1, the buffer circuit shown in FIG. 13 also can suppress the offset voltage in a wide range of output current. Note that the use of bipolar transistors is more advantageous in that the elements can be designed more easily to accurately set the current flowing in a current mirror circuit at a given ratio. The buffer circuits using bipolar transistors are advantageous also to increase the output current and enhance the driving capability.

10. Examples of Setting of the Size Ratio

Figure 15:
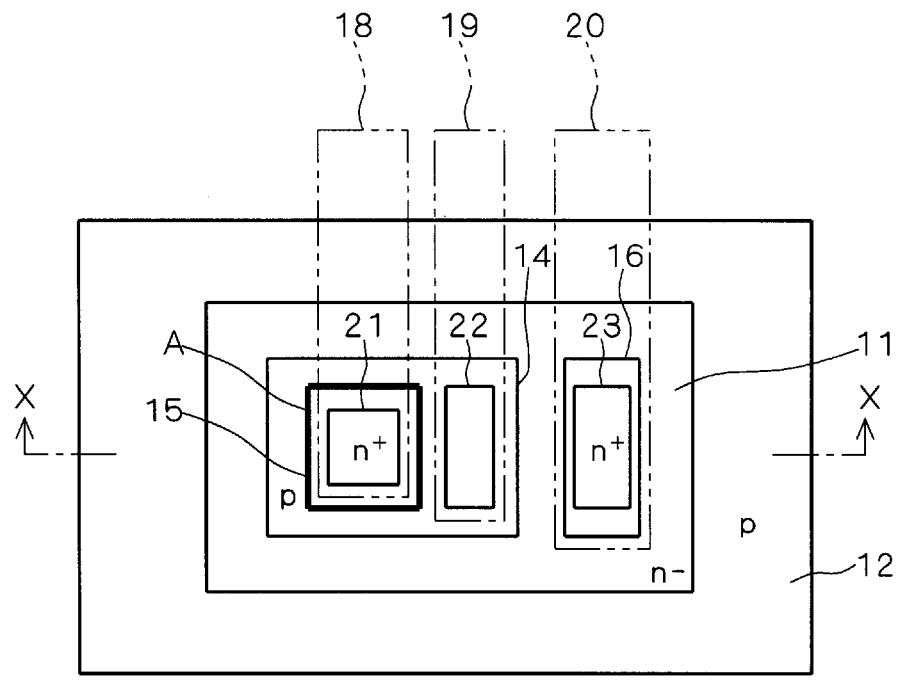
FIGS. 15 and 16 are a plane view and a sectional view illustrating an example of setting of the size ratio.
Figure 16:
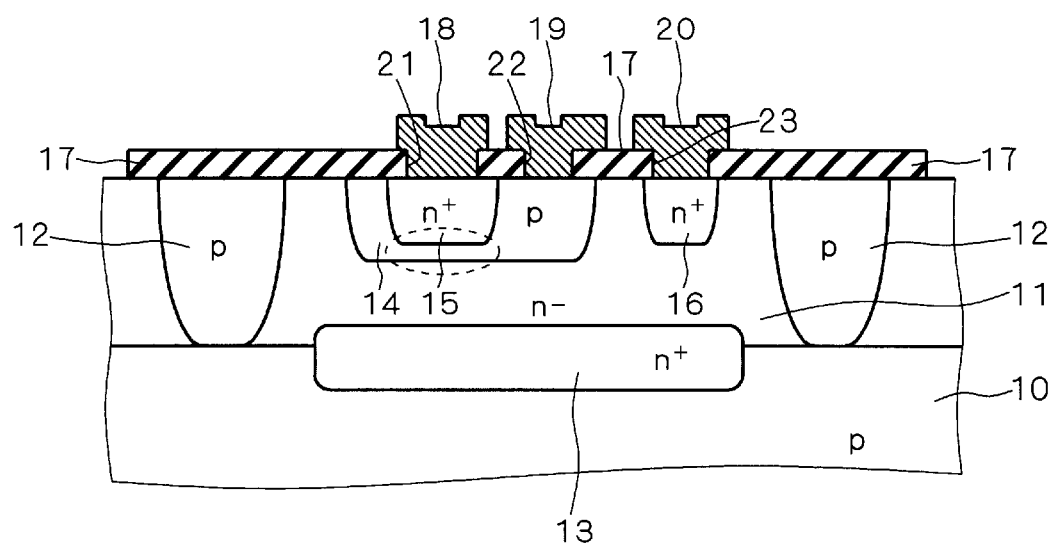

Now examples about the setting of the size ratio of the transistors used in the buffer circuits of the preferred embodiments will be described. FIG. 15 is a plane view showing the structure of an npn-type lateral bipolar transistor. FIG. 16 is the sectional view taken along the line X—X in FIG. 15. In this transistor, an n⁻ epitaxial layer 11 is formed on a p type substrate 10. An n⁺ buried diffusion layer is selectively formed at the junction between the p type substrate 10 and the n⁻ epitaxial layer 11.

In the n⁻ epitaxial layer 11, a p base layer 14 and an n⁺ collector layer 16 are selectively formed with their surfaces exposed, and a p type isolation layer 12 is formed to surround them to a depth reaching the p type substrate 10. An n⁺ emitter layer 15 is selectively formed inside the p base layer 14 with its surface exposed. An emitter electrode 18, base electrode 19 and collector electrode 20 are connected to the n⁺ emitter layer 15, p base layer 14 and n⁺ collector layer 16 through the openings 21, 22 and 23 formed in the insulating film 17, respectively.

Figure 17:
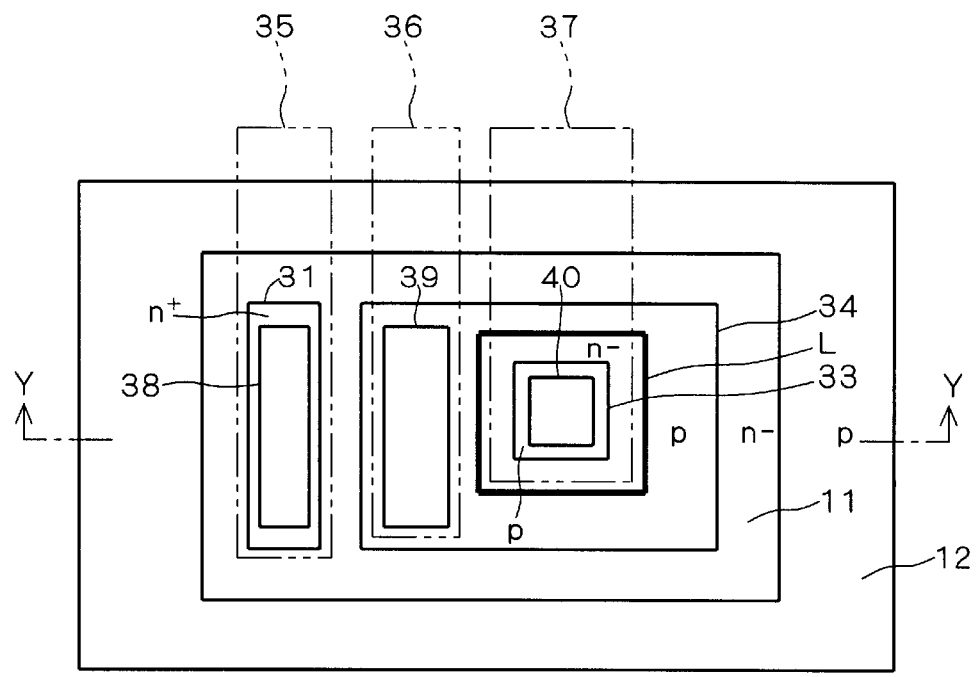
FIGS. 17 and 18 are a plane view and a sectional view illustrating an example of setting of the size ratio.
Figure 18:
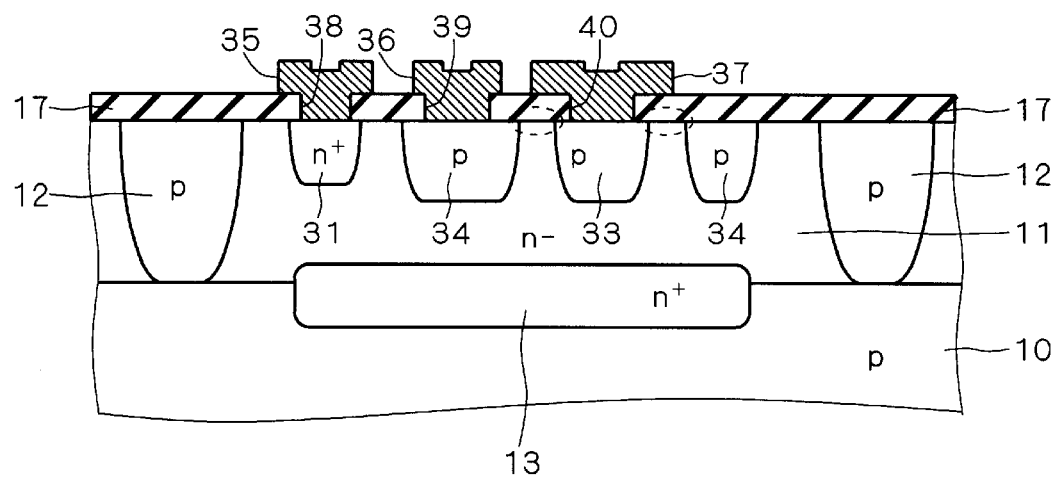

FIG. 17 is a plane view showing the structure of a pnp lateral type bipolar transistor. FIG. 18 is the sectional view taken along the line Y—Y in FIG. 17. In this transistor, an n⁺ base layer 31, p collector layer 34 and p emitter layer 33 are selectively formed in an n⁻ epitaxial layer 11 with their surfaces exposed. A base electrode 35, collector electrode 36 and emitter electrode 37 are connected to the n+base layer 31, p collector layer 34 and p emitter layer 33 through the openings 38, 39 and 40 formed in the insulating film 17, respectively.

The regions surrounded by broken lines in FIG. 16 and FIG. 18 (which are called "base region" herein) are the regions which determine the characteristics of these lateral bipolar transistors. In the npn type transistor, in the p base layer 14 sandwiched between the n⁺ emitter layer 15 and the n⁻ epitaxial layer 11, the region having the smallest width between the two layers, i.e. the base region right under the n⁺ emitter layer 15, determines its characteristics, and other regions do not affect the characteristics so much. Accordingly the size ratio of transistors can be determined through the ratio of the areas A of the base regions. In the pnp type transistor, the region through which the p emitter layer 33 and the p collector layer 34 face each other corresponds to the effective base region, and the size ratio of transistors can be determined through the ratio between the circumference lengths of the base regions i.e., the base facing lengths L.

Though not shown, the size ratio of MOSFETs can be set through ratio in their gate width. The size ratio of transistors can thus be set at a desired ratio in the process of manufacture.

11. Modifications (1) Needless to say, like the buffer circuit of the second preferred embodiment which is formed in a symmetrical relation with respect to the buffer circuit of the first preferred embodiment, it is also possible to form buffer circuits having a symmetrical relation with the buffer circuits of the third to seventh, and ninth preferred embodiments. The buffer circuits thus constructed can draw in the output current like the buffer circuit of the second preferred embodiment.

(2) A hold circuit can be formed by connecting a capacitance element CC as shown in FIGS. 10 to 12 in the buffer circuit of the ninth preferred embodiment. A hold circuit thus constructed can suppress the offset voltage, with the capacitance element CC having a large capacity.

While the invention has been described in detail, the foregoing description is in all aspects illustrative and not restrictive. It is understood that numerous other modifications and variations can be devised without departing from the scope of the invention.

What is claimed is:

1. A buffer circuit comprising:
   a first transistor having a first main electrode, a second main electrode, and a control electrode,
   a second transistor of the same conductivity type as said first transistor having a first main electrode connected to said first main electrode of said first transistor, a second main electrode, and a control electrode, said first and second transistors having a size ratio of m:n (m, n=positive real numbers);
   a first power supply line connected to said second main electrode of said first transistor;
   a third transistor having its first main electrode connected to said first main electrodes of said first and second transistors and its control electrode connected to said control electrode of said second transistor, said third transistor having the same conductivity type as said second transistor and having a size ratio of 1/n times with respect to said second transistor;

a first current mirror circuit connected to a second main electrode of said third transistor and said first power supply line and outputting a current which is p times (p=a positive real number) a main current of said third transistor;

a second power supply line; and a second current mirror circuit connected to said first main electrodes of said first to third transistors, said first current mirror circuit and said second power supply line and supplying to said first main electrodes of said first to third transistors a current which is (m+n+1)/p times said current outputted from said first current mirror circuit.

2. The buffer circuit according to claim 1, wherein said second current mirror circuit comprises, a fourth transistor having its first main electrode connected to said second power supply line and its second main electrode connected to said first main electrodes of said first to third transistors, and a fifth transistor having its first main electrode connected to said second power supply line and its second main electrode and its control electrode connected to said first current mirror circuit and said control electrode of said fourth transistor, said fifth transistor having the same conductivity type as said fourth transistor and having a size ratio of p/(m+n+1) times with respect to said fourth transistor.

3. The buffer circuit according to claim 1, wherein said first current mirror circuit comprises, a sixth transistor having its first main electrode connected to said first power supply line and its second main electrode and its control electrode connected to said second main electrode of said third transistor, and a seventh transistor having its first main electrode connected to said first power supply line, its second main electrode connected to said second current mirror circuit, and its control electrode connected to said control electrode and said second main electrode of said sixth transistor, said seventh transistor having the same conductivity type as said sixth transistor and having a size ratio of p times with respect to said sixth transistor.

4. The buffer circuit according to claim 1, further comprising a starting circuit for causing said first to third transistors to change from a cut-off state to a conductive state when a voltage is applied between said first and second power supply lines.

5. The buffer circuit according to claim 2, further comprising, a first resistor element having its one end connected to said first power supply line, and an eighth transistor having its first main electrode connected to the other end of said first resistor element, its second main electrode connected to said second power supply line, and its control electrode connected to said control electrode of said fourth transistor.

6. The buffer circuit according to claim 2, further comprising a starting circuit connected to said control electrode of said first transistor, said second main electrode of said second transistor and said control electrode of said fourth transistor, for driving said control electrode of said fourth transistor in such a direction that the current of said fourth transistor increases only when a potential difference between said control electrode of said first transistor and said control electrode of said second transistor exceeds a reference value.

7. The buffer circuit according to claim 6, wherein said starting circuit comprises a ninth transistor having its first main electrode connected to said second main electrode of said second transistor, its control electrode connected to said control electrode of said first transistor, and its second main electrode connected to said control electrode of said fourth transistor.

8. The buffer circuit according to claim 2, further comprising, a second resistor element having its one end connected to said first power supply line, a tenth transistor having its first main electrode connected to said second power supply line, its control electrode connected to said control electrode of said fourth transistor, and its second main electrode connected to the other end of said second resistor element, and having the same conductivity type as said fourth transistor, an eleventh transistor having its first main electrode connected to said other end of said second resistor element and its second main electrode connected to said control electrode of said fourth transistor, and a circuit for holding constant the potential difference between a control electrode of said eleventh transistor and said first power supply line.

9. The buffer circuit according to claim 1, further comprising, a twelfth transistor having its first main electrode connected to said second main electrode and said control electrode of said first transistor and its second main electrode connected to said first power supply line, and having the same conductivity type as said first transistor, and a thirteenth transistor having its first main electrode connected to said second main electrode and said control electrode of said second transistor and its second main electrode connected to its control electrode, said thirteenth transistor having the same conductivity type as said twelfth transistor and having a size ratio of n/m times with respect to said twelfth transistor.

10. The buffer circuit according to claim 9, further comprising, a fourteenth transistor having its first main electrode connected to said first main electrodes of said first to third transistors and its second main electrode connected to its control electrode, said fourteenth transistor having the same conductivity type as said first transistor and having a size ratio of one times with respect to said first transistor, and a fifteenth transistor having its first main electrode connected to said second main electrode of said fourteenth transistor and its second main electrode connected to said first power supply line, said fifteenth transistor having the same conductivity type as said twelfth transistor and having a size ratio of one times with respect to said twelfth transistor.

11. A buffer circuit comprising:

a first buffer circuit; and a second buffer circuit, each of said first and second buffer circuits comprising:

a first transistor having a first main electrode, a second main electrode, and a control electrode, a second transistor of the same conductivity type as said
first transistor having a first main electrode connected
to said first main electrode of said first transistor, a
second main electrode, and a control electrode, said
first and second transistors having a size ratio of m:n
(m, n=positive real numbers);

a first power supply line connected to said second main
electrode of said first transistor;

a third transistor having its first main electrode connected
to said first main electrodes of said first and second
transistors and its control electrode connected to said
control electrode of said second transistor, said third
transistor having the same conductivity type as said
second transistor and having a size ratio of 1/n times
with respect to said second transistor;

a first current mirror circuit connected to a second main
electrode of said third transistor and said first power
supply line and outputting a current which is p times
(p=a positive real number) a main current of said third
transistor;

a second power supply line; and a second current mirror circuit connected to said first main
electrodes of said first to third transistors, said first
current mirror circuit and said second power supply
line and supplying to said first main electrodes of said
first to third transistors a current which is (m+n+1)/p
times said current outputted from said first current
mirror circuit, and said second buffer circuit further comprising:

a fourth transistor having its first main electrode connected to said second main electrode and said control
electrode of said first transistor and its second main
electrode connected to said first power supply line, and
having the same conductivity type as said first
transistor, and a fifth transistor having its first main electrode connected
to said second main electrode and said control electrode
of said second transistor and its second main electrode
connected to its control electrode, said fifth transistor
having the same conductivity type as said fourth transistor and having a size ratio of n/m times with respect
to said fourth transistor, wherein between said first and second buffer circuits, said
first power supply lines are connected to each other,
said second power supply lines are connected to each
other, said control electrode of said first transistor in the
first buffer is connected to said control electrode of said
fourth transistor, and said second main electrode of said
second transistor in the first buffer is connected to said
second main electrode of said fifth transistor.

12. A hold circuit comprising:

a buffer circuit comprising;

a first transistor having a first main electrode, a second
main electrode, and a control electrode;

a second transistor of the same conductivity type as said
first transistor having a first main electrode connected
to said first main electrode of said first transistor, a
second main electrode, and a control electrode, said
first and second transistors having a size ratio of m:n
(m, n=positive real numbers);

a first power supply line connected to said second main
electrode of said first transistor;

a third transistor having its first main electrode connected
to said first main electrodes of said first and second
transistors and its control electrode connected to said
control electrode of said second transistor, said third
transistor having the same conductivity type as said
second transistor and having a size ratio of 1/n times
with respect to said second transistor;

a first current mirror circuit connected to a second main
electrode of said third transistor and said first power
supply line and outputting a current which is p times
(p=a positive real number) a main current of said third
transistor;

a second power supply line; and a second current mirror circuit connected to said first main
electrodes of said first to third transistors, said first
current mirror circuit and said second power supply
line and supplying to said first main electrodes of said
first to third transistors a current which is (m+n+1)/p
times said current outputted from said first current
mirror circuit, and a capacitance element having its one end connected to
said second main electrode of said second transistor
and its other end connected to any of said first power
supply line, said second power supply line, and a stable
potential line holding a certain potential with respect to
said first and second power supply lines.

* * * * *